US007245246B2

(12) United States Patent
Ihs et al.

(10) Patent No.: US 7,245,246 B2
(45) Date of Patent: Jul. 17, 2007

(54) CONVERTER, CIRCUIT AND METHOD FOR COMPENSATION OF NON-IDEALITIES IN CONTINUOUS TIME SIGMA DELTA CONVERTERS

(75) Inventors: Hassan Ihs, Toulouse (FR); Babak Bastani, Toulouse (FR); Jalal Ouaddah, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/534,119

(22) PCT Filed: Nov. 3, 2003

(86) PCT No.: PCT/EP03/50778

§ 371 (c)(1),
(2), (4) Date: May 5, 2005

(87) PCT Pub. No.: WO2004/042932

PCT Pub. Date: May 21, 2004

(65) Prior Publication Data

US 2006/0012499 A1    Jan. 19, 2006

(30) Foreign Application Priority Data

Nov. 6, 2002    (EP) ................... 02292758

(51) Int. Cl.
*H03M 3/00*    (2006.01)

(52) U.S. Cl. .................. 341/143; 341/118; 341/120

(58) Field of Classification Search ............... 341/143, 341/118, 120, 155
See application file for complete search history.

(56) References Cited

U.S. PATENT DOCUMENTS

| 5,084,702 | A | * | 1/1992 | Ribner ................... 341/143 |
| 5,196,853 | A | | 3/1993 | Abbiate et al. |
| 5,790,062 | A | * | 8/1998 | Darnell et al. .......... 341/143 |
| 6,016,112 | A | * | 1/2000 | Knudsen ................. 341/118 |
| 6,271,782 | B1 | * | 8/2001 | Steensgaard-Madsen .... 341/143 |
| 6,275,177 | B1 | * | 8/2001 | Ho et al. ................. 341/143 |
| 6,407,685 | B1 | * | 6/2002 | Handel et al. ........... 341/120 |
| 6,653,958 | B1 | * | 11/2003 | Morche .................. 341/118 |
| 6,812,876 | B1 | * | 11/2004 | Miller ................... 341/143 |
| 2001/0038350 | A1 | | 11/2001 | Paillardet |
| 2002/0175846 | A1 | * | 11/2002 | Sakimura ................ 341/143 |

* cited by examiner

Primary Examiner—Linh V. Nguyen

(57) ABSTRACT

A continuous time sigma delta converter has a filter and converter components having known non-ideal characteristics. A compensation circuit has error modelling components arranged to model the non-ideal characteristics of the converter. A summation block combines a compensation signal from the compensation circuit with a non-ideal output signal from the converter in order to provide a compensated output signal. This has substantially no effect on other modulator performance characteristics and contributes to the implementation of giga sample-per-second Continuous Time sigma deltas having the dynamic range capabilities of traditional DT sigma deltas.

9 Claims, 5 Drawing Sheets

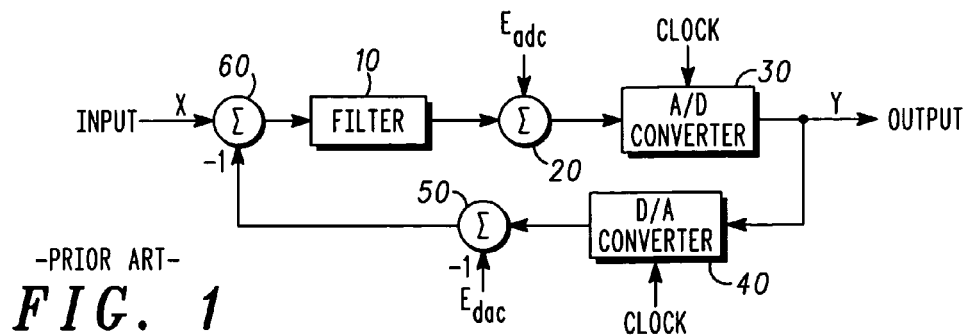
*FIG. 1* -PRIOR ART-
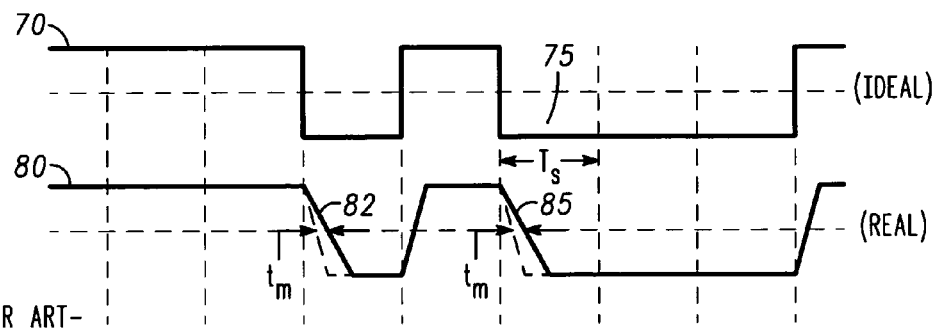
*FIG. 2* -PRIOR ART-
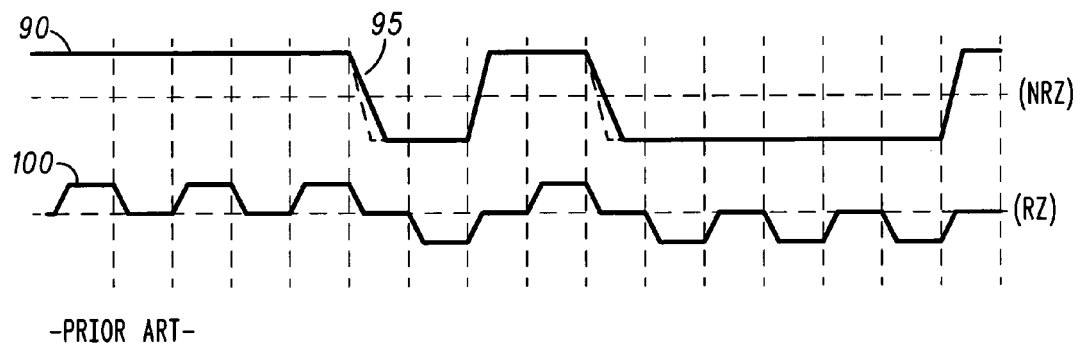
*FIG. 3* -PRIOR ART-
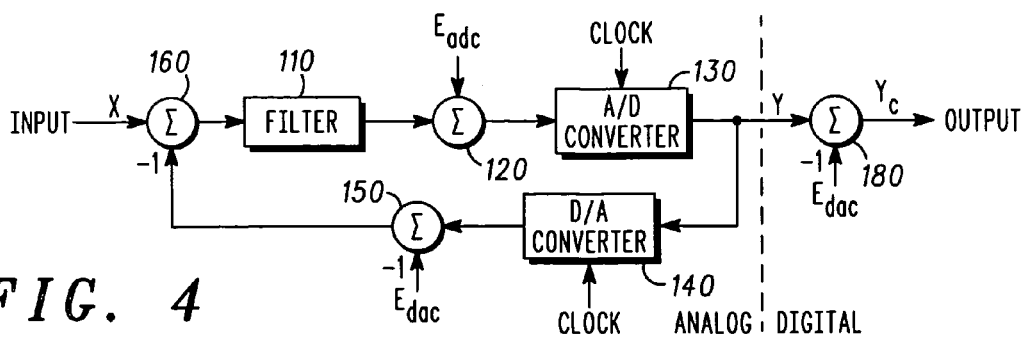
*FIG. 4*

CONVERTER, CIRCUIT AND METHOD FOR COMPENSATION OF NON-IDEALITIES IN CONTINUOUS TIME SIGMA DELTA CONVERTERS

CROSS-REFERENCE TO RELATED APPLICATIONS

This invention is related to PCT Application serial number PCT/EP03/50778, filed Nov. 3, 2003, by Hassan Ihs et. al; titled "Converter, Circuit and Method for Compensation of Non-Idealities in Continuous Time Sigma Delta Converters" and assigned to the assignee hereof.

This invention is related to EPC Application serial number 02292758.6, filed Nov. 6, 2002, by Hassan Ihs et al; titled "Converter, Circuit and Method for Compensation of Non-Idealities in Continuous Time Sigma Delta Converters" and assigned to the assignee hereof.

FIELD OF THE INVENTION

This invention relates to analogue-to-digital and digital-to-analogue converters, and particularly to such converters based on continuous time Sigma Delta Modulation.

BACKGROUND OF THE INVENTION

Continuous Time (CT) Sigma Delta Analogue-to-Digital and Digital-to-Analogue converters (ADCs), are considered the most appropriate type of ADC for high signal bandwidth applications. Indeed, CT sigma delta modulators have Factors Of Merit (FOM) from five to ten times better than their Discrete Time (DT) counterparts, and even better when compared to other Nyquist rate ADCs. The FOM indicates the amount of power needed to convert an analogue signal to the least-significant-bit (LSB) of a digital signal and thus reflects the power consumption of the converter for a given resolution (a given number of bits).

CT Sigma Delta modulators are of interest especially in the area of wireless communications, as they provide potential alternatives to bulky and high power consuming switched capacitor Sigma Delta modulators used in both I (In-phase) and Q (Quadrature-phase) channels of radio Intermediate Frequency (IF) sections. As recent 3rd generation (3G) wireless standards require higher IF signal bandwidth with little or no change in the signal Dynamic Range (DR), the power consumption will dramatically increase if switched capacitor sigma deltas continue to be used in future 3G IF sections.

Although CT sigma deltas are the most power efficient ADCs, nevertheless, some of their non-idealities severely limit their maximum achievable dynamic range. Two main non-idealities are the most limiting in CT sigma delta ADCs: (i) asymmetric rising and falling edges of the feedback path signal, and (ii) sampling clock jitter. These two problems, if addressed, would allow a CT sigma delta ADC to be widely used in all aspects of low power, high signal bandwidth and high sampling frequency applications. The asymmetric rising and falling edges error may be referred to as Intersymbol Interference error. The harmonic distortions it introduces may be also referred to as Intersymbol Distortions.

Referring firstly to FIG. 1, the general scheme of a known sigma delta modulator is constituted of a loop filter 10 (an integrator in general) of function H, an n-bit ADC 30 and an n-bit DAC 40, a feedback summation block 60 and two error components associated with non-idealities: a first error component 20 of the forward path ($E_{adc}$) and a second error component 50 of the feedback path ($E_{dac}$). The filter 10 may be Discrete Time (DT) such as a switched capacitor filter, or continuous time such as an active RC or Gm-C filter.

The modulator of FIG. 1 is characterized by the following equation that expresses the modulator's output Y as function of the input X, the function H of the filter 10 and the error components $E_{adc}$ and $E_{dac}$:

$$Y = X\frac{H}{1+H} + E_{dac}\frac{H}{1+H} + E_{adc}\frac{1}{1+H} \qquad \text{(Equation 1)}$$

The function $$\frac{H}{1+H}$$

is a low-pass filter while $$\frac{1}{1+H}$$

is a high-pass filter. Thus, the non idealities of the forward path are high-pass filtered (noise-shaped) while the feedback path non-idealities are untouched and remain present in the signal baseband. Equation 1 shows clearly that the feedback path non-ideality errors $E_{dac}$ are present in the signal baseband.

In multi-bit sigma deltas, the multi-bit feedback DAC suffers from non-linearity errors due to component mismatches. These errors show up as harmonics in the signal baseband in accordance with Equation 1. This is the main reason that single bit modulators are the most widely used in sigma delta ADCs since a one-bit feedback DAC is inherently linear.

Feedback path asymmetric rising/falling edges and sampling clock jitter are by far the most critical feedback path non-idealities in CT sigma deltas. These non-idealities do not significantly affect DT sigma deltas thanks to the sample and hold feature inherent in switched capacitor circuits. The errors related to clock jitter are not in fact created inside the feedback path, but are rather produced by the circuitry that generates the clock. However the asymmetric rising/falling edges do originate from device mismatches in the feedback path. For the sake of simplicity, only single-bit sigma delta modulation is considered below. It will be understood that the following analysis for single-bit modulators can be extended to multi-bit modulators using well-known minor modifications.

The main sources of asymmetric rising/falling edges are mismatches between the path rising and falling time constants, the non-balanced or non-symmetric feedback DAC voltage thresholds, the non-symmetric spikes produced during signal transitions, etc.

Referring now to FIG. 2, there is shown a timing diagram which depicts an example of an ideal signal 70 and a real signal 80, both having a time period $T_s$. The real signal 80 has asymmetric rise/fall times 82 and 85 of $t_m$. This error gives rise to even order harmonics including a strong DC component and also gives rise to large Intermodulation Distortions. It will be appreciated that even a small timing mismatch between rise and fall times can result in severe Signal to Noise and Distortion Ratio (SNDR) degradation.

From U.S. Pat. No. 5,196,853 there is known a robust technique that cancels distortion harmonics due to the asymmetric rising/falling edge mismatches. The technique, called Return to Zero (RZ), consists of returning to zero for half of each clock cycle the levels of a feedback DAC.

Referring now to FIG. 3 the RZ technique is shown. A non-RZ signal 90 exhibits usual behavior, including an asymmetric rising/falling edge 95. An RZ signal 100 cancels distortion harmonics due to the asymmetric rising/falling edges mismatches. The RZ signal 100 returns to zero for half of each clock cycle, and for the other half of each clock cycle, it follows the levels of the feedback DAC 40 of FIG. 1.

This method is widely used in data communications where such a signal coding results in reduced Intersymbol Interferences. The RZ operation makes all the signal levels sensitive to non-ideal rising and falling edges, in contrast to non-RZ (NRZ) operations where these non-idealities affect only signal levels that are adjacent to the transitions. In such a manner, the asymmetric transitions error appear as DC component error only, which is easily filtered with a digital high-pass filter in a subsequent portion of the circuitry.

However, the RZ technique, although it efficiently cancels the Intersymbol Interferences, suffers from many side effects. In fact, with the RZ technique the signal has now to settle and resolve in half a clock period. The settling process occurs at each clock cycle in contrast to the NRZ signals where it occurs only during signal transitions. The transition occurrence in RZ signals also occurs more often than in NRZ signals and leads to increased occurrence of settling solicitation. This gives rise to the following issues:

1. The problem that RZ is supposed to resolve reappears in high sampling frequencies since full settling may not occur during the Return to Zero phase.
2. The jitter in-band power increases by 12 dB (due the halved signal level duration needed in the RZ technique).
3. The loop filter H needs to settle within half a clock period rather than one period in NRZ, leading to doubled current consumption.
4. RZ technique doubles transition occurrence, leading to 6 dB increase in the power of transition spikes and errors.
5. RZ implementation requires additional circuitry that leads to additional current consumption and parasitics (e.g., switch charge injection, spikes).
6. The RZ technique does not compensate for a DC component; in fact, it shifts the power of the even order harmonics to DC.

A need therefore exists for compensation of feedback path non-idealities of continuous time sigma delta ADCs wherein al least some of the abovementioned disadvantage(s) may be alleviated.

STATEMENT OF INVENTION

In accordance with a first aspect of the present invention there is provided a continuous time sigma delta converter as claimed in claim 1.

In accordance with a second aspect of the present invention there is provided a compensation circuit as claimed in claim 3.

In accordance with a third aspect of the present invention there is provided a method as claimed in claim 4.

In accordance with a fourth aspect of the present invention there is provided a method as claimed in claim 9.

Preferably the summation block is arranged to subtract the compensation signal from the output signal in order to provide the compensated output signal.

The non-ideal characteristics are preferably associated with a feedback path of the converter. The non-ideal characteristics preferably include symmetrical errors associated with non-ideal rising and falling edges of signal transitions of the converter.

Preferably the non-ideal characteristics include asymmetrical errors associated with non-ideal rising and falling edges of signal transitions of the converter. The compensation circuit preferably has calibration parameters determined by an dichotomy technique which iteratively refines the values of the calibration parameters.

Preferably the calibration algorithm uses a dichotomy technique which iteratively refines the values of the calibration parameters.

In this way a converter, circuit and method for compensation in continuous time sigma delta converters is provided which efficiently compensates for feedback path non-idealities. The compensation circuitry is totally digital facilitating straightforward integration and minimizing related design effort. This has substantially no effect on other modulator performance characteristics and offers an alternative to commonly used compensation techniques that suffer from limiting side effects. It facilitates the implementation of giga sample-per-second CT sigma deltas having the dynamic range capabilities of traditional DT sigma deltas.

BRIEF DESCRIPTION OF THE DRAWINGS

One method and arrangement for compensation of feedback path non idealities of continuous time sigma delta ADCs incorporating the present invention will now be described, by way of example only, with reference to the accompanying drawings, in which:

FIG. 1 shows a prior art sigma delta converter illustrating non-ideal characteristics;

FIG. 2 shows a prior art timing diagram of ideal and real rising and falling edge transitions of the converter of FIG. 1;

FIG. 3 shows a known prior art technique (Return to Zero) for providing compensation against the non-ideal transitions of the circuit of FIG. 1;

FIG. 4 shows an illustrative circuit diagram of a converter and a notional digital domain error model according to the invention;

DESCRIPTION OF PREFERRED EMBODIMENT(S)

Figure 5:
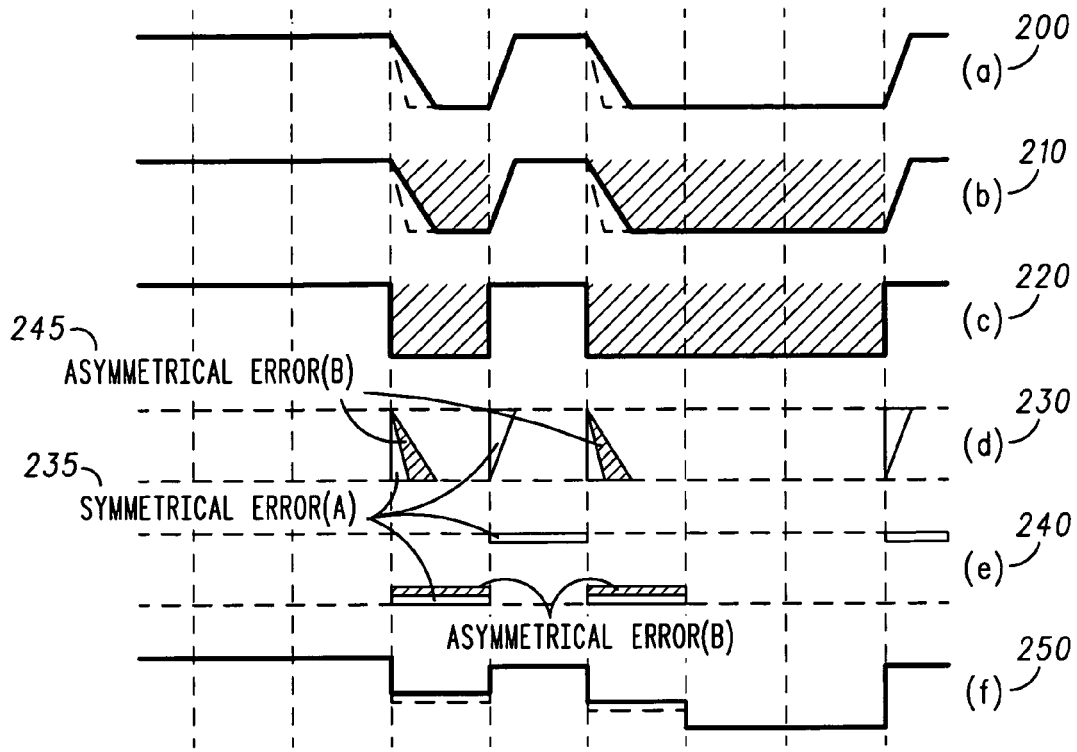
FIG. 5 shows a composite timing diagram illustrating transition errors associated with the circuit of FIG. 4.

As can be seen from equation 1 above, feedback DAC related error $E_{dac}$ is not noise-shaped and is transmitted in the same path as the input signal. If the same error signal can be reconstructed in the digital domain, it is possible to compensate for it by simply subtracting it from the output digital signal. The proposed method assumes that the error can be reconstructed in the digital domain using simple digital circuitry.

The principle is as follows: First, the error is reconstructed using digital circuitry that reproduces with a high degree of fidelity the analogue error $E_{dac}$. Second, this reconstructed digital error is subtracted from the digital PDM output signal before it passes through the decimation filter.

Referring now to FIG. 4, there is shown a circuit substantially similar to that of FIG. 1, having a loop filter 110 of function H, an ADC 130 and a DAC 140, a summation block 160 and error components 120 and 150. However, the circuit of FIG. 4 also includes an error compensation component 180, which represents the subtraction of $E_{dac}$.

The ADC transfer function for this subtraction is given by the following equation:

$$Y_C = X\frac{H}{1+H} - E_{dac}\frac{1}{1+H} + E_{adc}\frac{1}{1+H} \qquad \text{(Equation 2)}$$

Thus, unlike Equation 1 showing transfer function of a non compensated modulator, the DAC error $E_{dac}$ is now noise-shaped the same way as the ADC error $E_{adc}$. It is then removed from the signal baseband and its effect on the signal performances is no longer significant. Note that the error signal $E_{dac}$ is analogue and complex. It is therefore difficult to reproduce it with a high degree of fidelity using only digital means. It will be shown below that this is possible for errors resulting from asymmetric feedback path rising/falling edges using very simple circuitry.

To be able to reconstruct the signal error in the digital domain, it is first necessary to build up a model that represents the error mechanism.

The loop filter H (filter 10 of FIG. 1) is generally a simple integrator, at least for the feedback path signal. In practice, the modulator feedback path signal is subject to slewing due to parasitic time constants either on the feedback DAC or in the comparator or both. This gives rise to slow transitions that lead to an erroneous integrated signal at the output of the modulator's integrator.

Referring now also to FIG. 5 there is shown a signal 200 having slow transitions and the equivalent error components at the output of the integrator H (box 230). These components have been obtained by subtracting an integrated ideal signal 220 from an integrated real signal 210. Note that the signal integration corresponds to the area delimited by the signal itself and the time axis.

Within the box 230 there are two types of integrated signal error and these need to be modelled separately. The first type of error is represented by the symmetrical error areas 235, and this error is symmetric in the sense that the rising and falling edges are substantially equal. This type of error is referred to as a symmetric integrated error. The second type of error is represented by the asymmetrical error areas 245 and affects the falling edge only (it may similarly affect the rising edge only). It is referred to as asymmetric integrated error.

Since the modulator's ADC (comparator in case of single bit sigma delta) is active at clock rising edge only, the shape of the integrator output signal before a clock rising edge is of little interest as long as it converges to the final (theoretical, ideal) value at that instant.

It is therefore possible to model transition related errors with level equivalent error provided that they have the same integration area. The signal experiencing both errors (transition or level) will produce the same integrator output voltage at the clock rising edge. Thus, the error areas shown in box 230 may be equivalently modelled by the level error areas shown in box 240. The areas produce the same effects since their areas are equal. Finally, the level equivalent error is shown in waveform 250.

It is useful to normalize the transition integrated error areas 235 and 245 with respect to a unit level area $V_{dac}*T_s$, where $V_{dac}$ represents the signal level voltage. The normalized errors for both 235(A) and 245(B) are respectively:

$$a = \frac{A}{V_{dac}T_S} \qquad \text{(Equation 3)}$$
$$b = \frac{B}{V_{dac}T_S}$$

Now that a level representation of the error is derived, it is possible to set a model that generates the transition errors of both A and B types. As the errors manifest themselves only when a transition occurs, a transition detector is needed in the model. A simple derivator may be used for that purpose but any other circuit that detects transitions can be used too.

Figure 6:
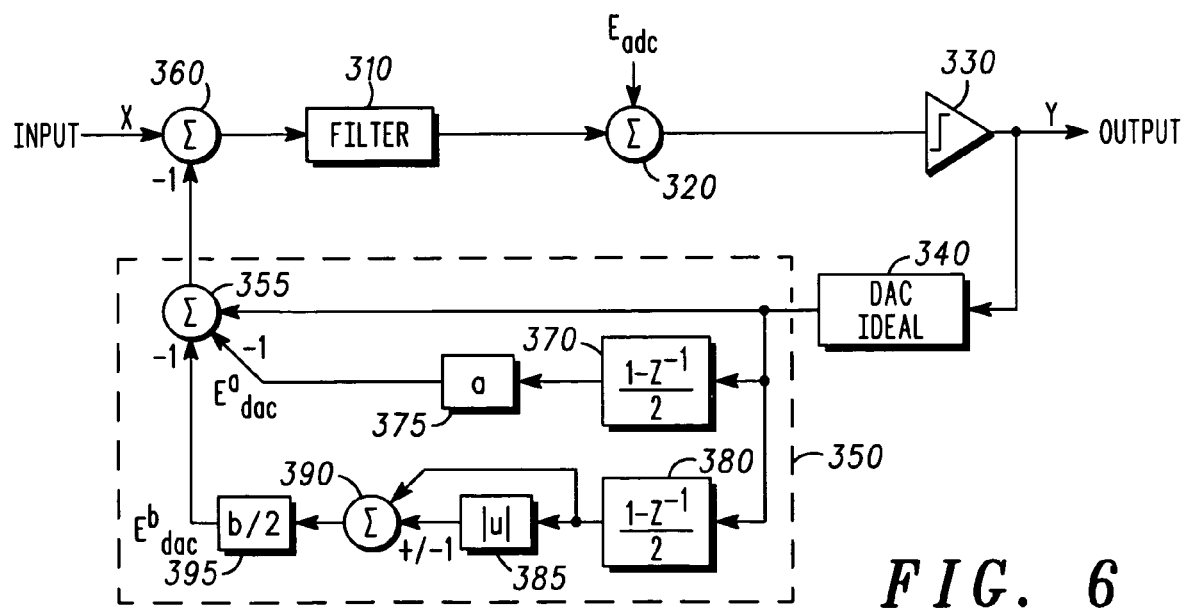
FIG. 6 shows an illustrative circuit diagram of a compensation circuit according to the invention.

Referring now also to FIG. 6, there is shown a circuit in which the whole model of the transition related errors is presented. Again the circuit is substantially similar to that of FIG. 1, having a loop filter 310 of function H, an ADC 330, a summation block 360 and error components 320 and 350. However, the circuit of FIG. 6 incorporates an ideal DAC 340 and an error modelling circuit 350 to be further described below.

To represent the level equivalent of the type A error (symmetric error), a derivator 370 of transfer function $$\frac{1-z^{-1}}{2}$$

is used within the modelling circuit 350 to detect transitions, and an attenuation factor a (the normalized error A) that scales the derivator levels is provided by block 375. The derivator 370 generates a level of the same amplitude as the feedback path signal when a transition occurs. It returns and remains at zero when the signal is not in transition. For example, assuming that the DAC delay can be represented by a first order low pass filter time constant τ. The error area A is $A=\tau*V_{dac}$ and the parameter $a=\tau/T_s$.

Similarly the asymmetric transition error (error type B) is generated in the modelling circuit 350 using a derivator 380 whose output passes through two different paths. The first path is a simple wire which is coupled to a summation block 390, the second path contains the absolute value function |u| (block 385), which is then fed to the summation block 390. The summation of both paths allows the negative part of the derivator output to be cancelled. This allows the injection of an error representing asymmetric error due to a slower rising edge. Alternatively, the subtraction of the second signal path from the first cancels the positive part of the derivator 380 output signal and thus models the asymmetric error due to a slower falling edge. An attenuation factor b (the normalized error B) is used to scale down the signal error in block 395. The absolute value function is a non linear functions that gives rise to even number harmonics only.

It has been shown above that the parameter b is critical to error compensation. The parameter a is 10 times less critical than b. It is not generally taken into account except when its value is too high or when the modulator's OSR is low. When this parameter is too high, it may limit the maximum achievable peak SNDR by giving rise to third harmonics appearing only when the input signal is close to the full scale. When the OSR is low, it may increase the noise floor due to the leakage it introduces in the modulator Noise Transfer Function (NTF).

The errors that are due to feedback path symmetric and asymmetric transitions are respectively expressed in the following equations:

$$E_{dac}^{a}(z) = \frac{1-z^{-1}}{2} aY(z) \qquad \text{(Equation 4)}$$

$$E_{dac}^{b}(z) = \left[\frac{1-z^{-1}}{2} Y(z) \mp \left|\frac{1-z^{-1}}{2} Y(z)\right|\right] \frac{b}{2} \qquad \text{(Equation 5)}$$

Now that a simple model is derived for the feedback path non-idealities error, it is now possible to reconstruct in the digital domain the same error and subtract it from the signal.

Figure 7:
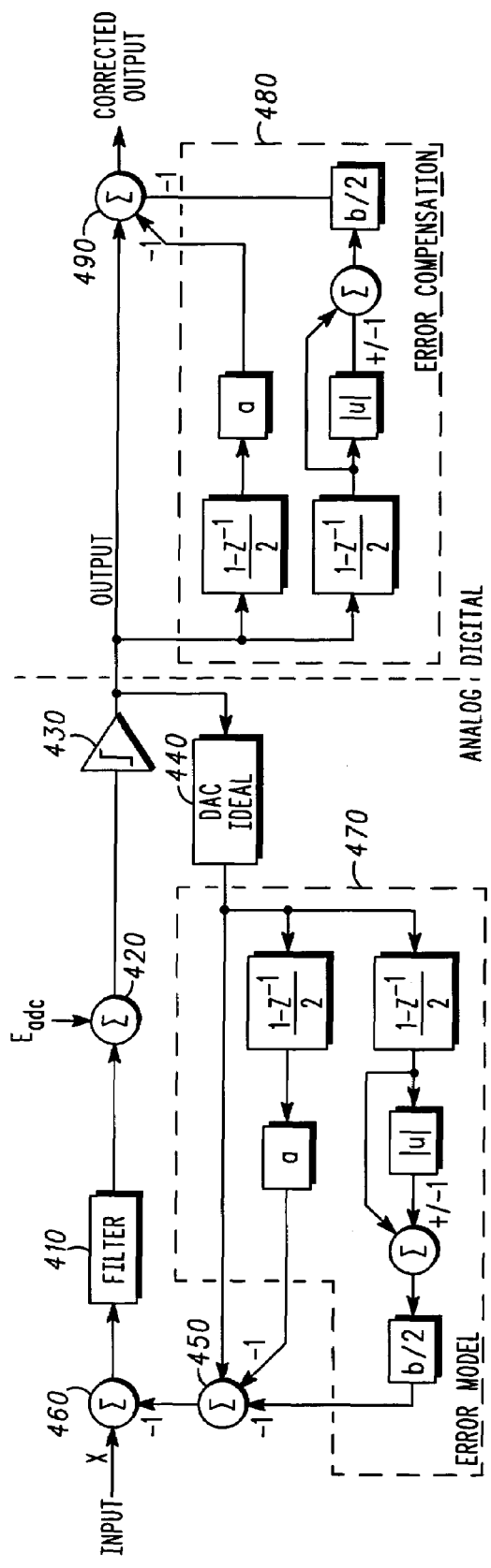
FIG. 7 shows an illustrative circuit diagram of a converter having an ideal DAC and a notional error model, including the compensation circuit of FIG. 6.

Referring now to FIG. 7 there is shown a digital compensation scheme using the modelling circuit of FIG. 6. The circuit of FIG. 7 is substantially similar to that of FIG. 6, having a loop filter 410 of function H, an ADC 430, an error component 420, an ideal DAC 440, a summation block 460 and an error modelling circuit 450. A second error modelling circuit 480, substantially identical to the error modelling circuit 450 is provided in the digital domain and its output is subtracted from the modulator's output. It is important that the parameters a and b implemented in the digital side match perfectly their analogue equivalent, otherwise the compensation will be leaky, similar to cascaded sigma delta modulation where the digital compensation coefficients have to match their analogue counterparts. Below an algorithm is presented that determines the optimal parameters a and b.

Figure 8:
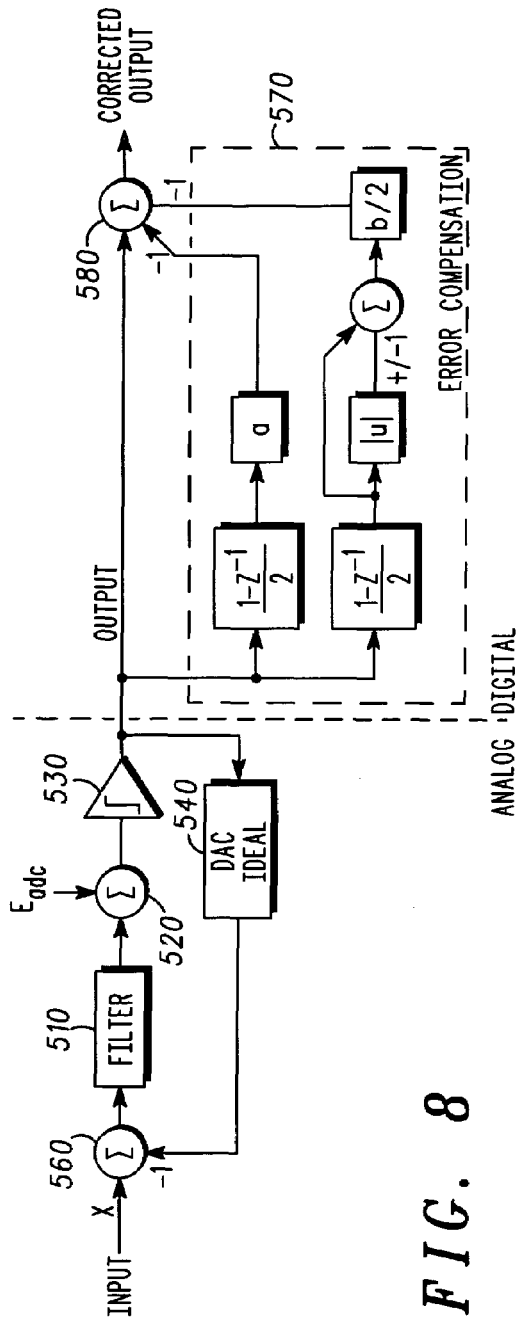
FIG. 8 shows an illustrative circuit diagram of the converter and compensation circuit of FIG. 7 with a real DAC.

The actual implementation of the compensation technique doesn't show the analogue model of the error since it is intrinsic to the feedback path. Referring now also to FIG. 8, there is shown an actual implementation using a real feedback DAC 540 in addition to a loop filter 510 of function H, an ADC 530, an error component 520, a summation block 560 and an error modelling circuit 570 provided in the digital domain having its output is subtracted from the modulator's output.

All the functions used in the compensation paths are easily implemented in the digital domain including the absolute value function. As the modulator's output is a bit stream of 0s and 1s, one may ask how the compensation functions are applied on a single bit signal. In fact 0 and 1 in sigma delta represent respectively negative and positive full scale signals. Before going through the compensation circuitry they need first to be converted to full scale binary words. For instance, in an 8 bit signed binary word, 0 would be converted to "01111111" and 1 would be converted to "11111111".

The compensation scheme of FIG. 8 requires parameters a and b that represent the magnitude of the feedback non-ideality error to be experimentally measured. The direct measurement of these parameters is not straightforward and typically involves the use of non-standard apparatus such as a Time Interval Analyzer. One easy way to measure their real values is to use a search algorithm that tries many arbitrary values picked using some informed means (dichotomy) and then selecting the optimal values.

To make this calibration procedure time effective, the compensation circuit needs to be duplicated in software mode so as to be able to run off-line (without soliciting the IC under calibration at each calibration process cycle). The calibration procedure needs to be performed for each parameter separately.

The procedure works as follows:

1—One set of ADC (the device under calibration) output samples is collected. These samples need to have been collected using a sine wave signal of full scale amplitude applied at the input of the ADC. Having collected this set of samples, the calibration procedure can now run off-line.

2—The SNDR of the collected data is calculated and the power of the harmonics extracted. If the SNDR meets the specification the calibration procedure stops, otherwise a coarse estimation P2 of the parameter under calibration is made based on the importance of the second harmonic.

3—The calibration algorithm starts using the estimated coarse value P2 as the initial value.

The calibration algorithm uses a dichotomy technique to refine the values of the parameter under calibration at each loop cycle. The starting point is the coarse segment [P1, P2] containing the parameter under calibration, where, P1=0, P2 is the coarse value estimated in step 2 above. The program calculates the SNDR of the segment middle point (P1+P2)/2 and decides whether it needs to further refine the segment. If yes, two new segments are generated [P1=P1 P2=(P1+P2)/2] and [P1=(P1+P2)/2 P2=P2]. The SNDR of these two segments' middle points are calculated and the segment that contains the parameter under test is selected (the highest middle point SNDR). Tow new segments are generated again and the same process is repeated until the SNDR goal is reached or after a time-out period has elapsed.

Figure 9:
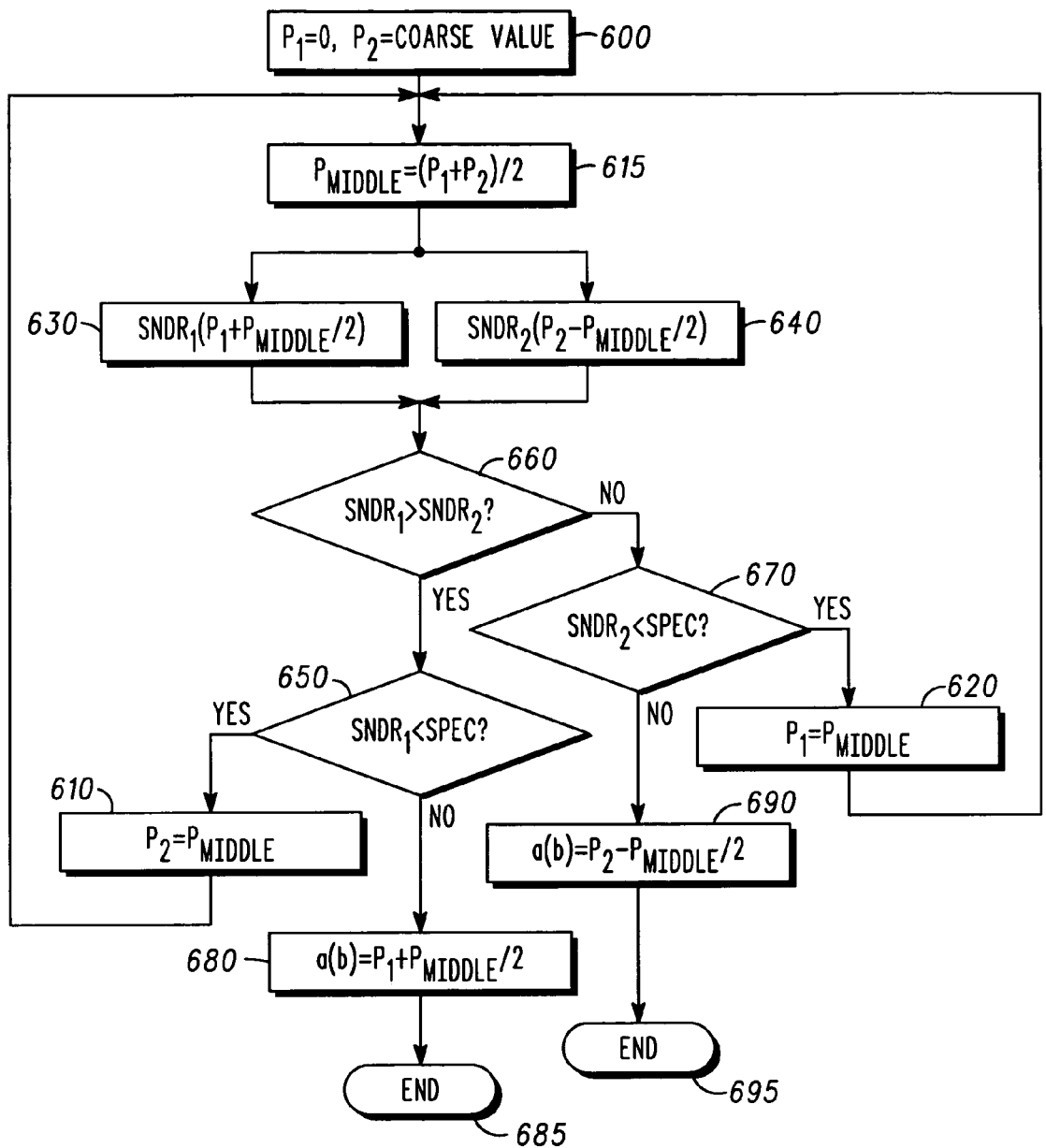
FIG. 9 shows an illustrative flow diagram of a dichotomy technique used to derive parameters for the compensation circuit of FIG. 6.

Referring now to FIG. 9 there is shown a flow diagram of the calibration algorithm. At the start of the algorithm (box 600) P1=0 and P2=the coarse value. The first of two calculation paths begins at block 610 where the calculation P2=(P1+P2)/2 is performed, and P1 is reset to the value of P1 in block 600. The second path begins at block 620 with the similar calculation P1=(P1+P2)/2 and P2 is reset to the value of P2 in block 600.

The results of block 610 are then used in the expression $SNDR_1(P1+(P1+P2)/4)$. Similarly the results of block 620 are used in the expression $SNDR_2(P2-(P1+P2)/4)$.

At block 660 the results of blocks 630 and 640 are compared: If $SNDR_1 > SNDR_2$ then the algorithm proceeds to block 650; if not then the algorithm proceeds to block 670.

At block 650, $SNDR_1$ is compared to the specification. If it passes the test, block 680 sets parameter a(b)=P1+(P1+P2)/4 and the program stops at block 685, yielding the value of the parameter. If not the algorithm proceeds to block 610, the value of P2 is refined according to P2=(P1+P2)/2 and the loop is reiterated.

Similarly at block 670, $SNDR_2$ is compared to the specification. If it passes the test, block 690 sets parameter a(b)=P2−(P1+P2)/4 and the program stops at block 695, yielding the value of the parameter. If not the algorithm proceeds to block 620, the value of P1 is refined according to P1=(P1+P2)/2 and the loop is reiterated.

The program stops when either SNDR$_1$ or SNDR$_2$ passes the spec, or when they do not vary for many loop cycles, or when they start to decay after peaking. In the latter two cases, the fault should not come from the feedback non-ideality but from something else and the circuit under calibration may be declared defective.

The number of cycles before convergence of this algorithm depends on the starting point P2 and the SNDR required. A starting Point P2 too far from the target and large SNDR result in many algorithm cycles before convergence is achieved. In all cases, no more than 10 cycles are required to achieve convergence as the dichotomy algorithm is the fastest one-dimension search algorithm. Ten cycles of the algorithm is a matter of milliseconds of CPU time and consequently has no significant impact on the test time.

Figure 10:
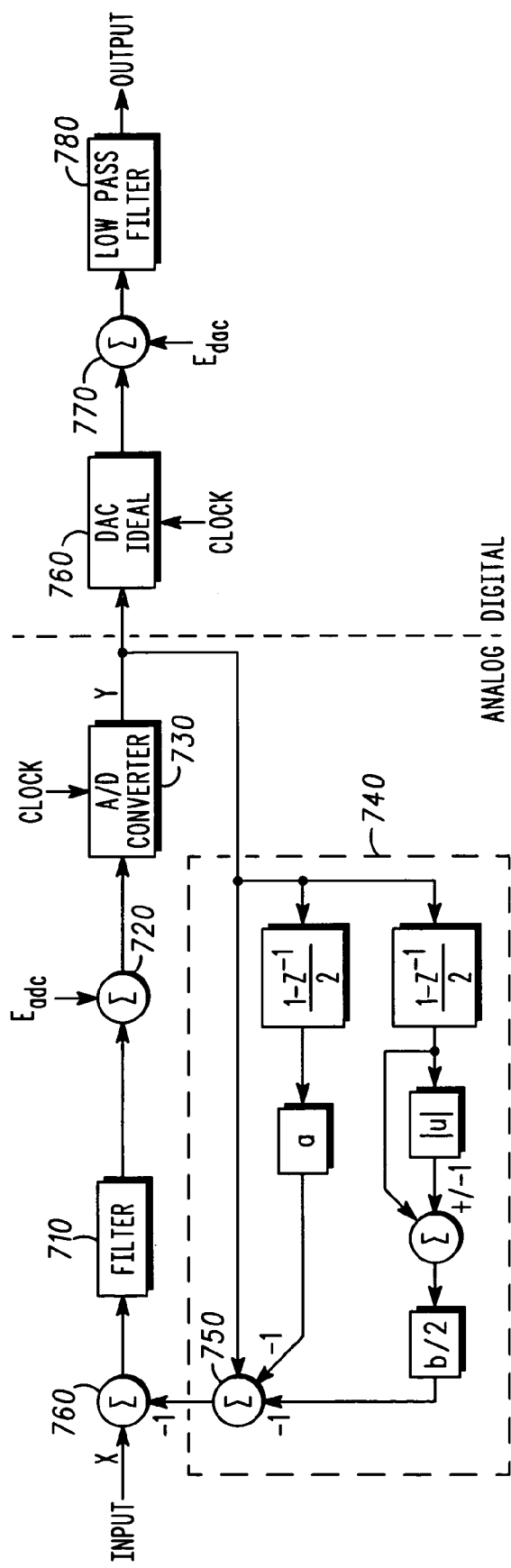
FIG. 10 shows an illustrative circuit diagram of a further compensation circuit according to the invention.

It will be readily appreciated that this technique may also be applied to Continuous Time Digital-to-Analog sigma delta modulation. Referring now also to FIG. 10, there is shown a sigma delta digital-to-analog conversion arrangement using a digital sigma delta modulator comprising filter 710, ADC 730 and associated error $E_{adc}$ 720 and a feedback path added to the input by summation block 760.

This digital arrangement is followed by an analog DAC 760 and a low pass filter 780. A DAC error Edac 770 is also present. Similarly to the Analog-to-Digital sigma delta modulation, this error may be cancelled by reproducing it in the digital domain using the compensation circuit 740 and adding it to the sigma delta modulator feedback path via summation block 750.

The DAC error is high pass-filtered in a similar manner to that of Equation 3 above. The same calibration algorithm as described above is also applicable.

It will be understood that the converter, circuit and method for compensation in continuous time sigma delta converters described above provides a technique that allows to efficiently compensate for feedback path non-idealities. The compensation circuitry is totally digital facilitating straightforward integration and minimizing the related design effort. The technique does not substantially affect other modulator performance characteristics and offers an alternative to commonly used compensation techniques that suffer from limiting side effects. Hence, it facilitates the implementation of giga sample-per-second CT sigma deltas having the dynamic range capabilities of traditional DT sigma deltas.

The present invention does not directly deal with the effect of jitter, however the compensation it provides for asymmetric rising/falling edges does not worsen the circuit jitter performance, in contrast to presently known techniques which do exactly that.

It will be appreciated that alternative embodiments to those described above are possible. For example, the precise arrangement of circuit elements and portions of the calibration algorithm may differ from those described above.

Furthermore the arrangement and application of sigma-delta modulator may differ from the examples described above.

The invention claimed is:

1. A continuous time sigma delta converter comprising:
conversion means having known non-ideal characteristics and arranged to provide an output signal;
a compensation circuit comprising error modelling components arranged to substantially model the non-ideal characteristics of the conversion means in order to provide a compensation signal, the non-ideal characteristics including asymmetrical errors associated with non-ideal rising and falling edges of signal transitions of the converter; and
summation means coupled to combine the compensation signal with the output signal in order to provide a compensated output signal.

2. The converter of claim 1 further characterized by:
the summation means being arranged to subtract the compensation signal from the output signal in order to provide the compensated output signal.

3. The converter of claim 1 further characterized by:
the non-ideal characteristics being associated with a feedback path of the converter.

4. The converter of claim 1 further characterized by:
the non-ideal characteristics including symmetrical errors associated with non-ideal rising and falling edges of signal transitions of the converter.

5. The converter of claim 1 further characterized by:
the compensation circuit having calibration parameters determined by a dichotomy technique which iteratively refines the values of the calibration parameters.

6. A method of compensating for known non-ideal characteristics in a continuous time sigma delta converter, the method comprising:
converting an input signal of one time domain to an output signal of another time domain using a converter having known non-ideal characteristics;
modelling the non-ideal characteristics of the converter in a compensation circuit, the non-ideal characteristics including asymmetrical errors associated with non-ideal rising and falling edges of signal transitions of the converter; and
combining a compensation signal output of the compensation circuit with the output signal of the converter in order to provide a compensated output signal.

7. The method of claim 6 further characterized by:
the non-ideal characteristics being associated with a feedback path of the converter.

8. The method of claim 6 further characterized by:
the non-ideal characteristics including symmetrical errors associated with non-ideal rising and falling edges of signal transitions of the converter.

9. The method of claim 6 further characterized by:
the compensation circuit having calibration parameters determined by a dichotomy technique which iteratively refines the values of the calibration parameters.

* * * * *